(12) United States Patent
Simmons et al.

(10) Patent No.: US 7,583,102 B1
(45) Date of Patent: Sep. 1, 2009

(54) TESTING OF INPUT/OUTPUT DEVICES OF AN INTEGRATED CIRCUIT

(75) Inventors: Tuyet Ngoc Simmons, Los Gatos, CA (US); Andy T. Nguyen, San Jose, CA (US); Andrew W. Lai, Fremont, CA (US); Randy J. Simmons, San Jose, CA (US); Shankar Lakkapragada, San Jose, CA (US)

(73) Assignee: XILINX, Inc., San Jose, CA (US)

( * ) Notice: Subject to any disclaimer, the term of this patent is extended or adjusted under 35 U.S.C. 154(b) by 78 days.

(21) Appl. No.: 11/429,584

(22) Filed: May 5, 2006

(51) Int. Cl.
*H03K 19/173* (2006.01)
(52) U.S. Cl. .............. 326/38; 326/47; 326/46
(58) Field of Classification Search ............ 326/37–41, 326/47, 30, 16; 327/298; 341/100; 714/725
See application file for complete search history.

(56) References Cited

U.S. PATENT DOCUMENTS

| | | | | |
|---|---|---|---|---|
| 5,168,177 A * | 12/1992 | Shankar et al. | ............... | 326/37 |
| 5,594,367 A * | 1/1997 | Trimberger et al. | ........... | 326/41 |
| 5,869,979 A * | 2/1999 | Bocchino | ..................... | 326/38 |
| 6,020,760 A * | 2/2000 | Sample et al. | ................ | 326/41 |
| 6,239,611 B1 * | 5/2001 | Matera | ......................... | 326/16 |
| 6,600,355 B1 * | 7/2003 | Nguyen | ...................... | 327/298 |
| 6,870,397 B1 * | 3/2005 | Fox et al. | ...................... | 326/41 |
| 7,091,890 B1 * | 8/2006 | Sasaki et al. | ................ | 341/100 |
| 7,109,744 B1 * | 9/2006 | Shumarayev et al. | ......... | 326/30 |
| 7,196,541 B2 * | 3/2007 | Nowak-Leijten | ............. | 326/38 |
| 7,392,446 B1 * | 6/2008 | Simmons et al. | ............ | 714/725 |

OTHER PUBLICATIONS

U.S. Appl. No. 11/156,039, filed Jun. 17, 2005, Simmons et al.

* cited by examiner

*Primary Examiner*—Rexford N Barnie
*Assistant Examiner*—Crystal L Hammond
(74) *Attorney, Agent, or Firm*—W. Eric Webostad

(57) ABSTRACT

Method and apparatus for testing input/output circuits of an integrated circuit are described. An integrated circuit includes input/output circuits having input/output pads. The input/output pads are capable of being coupled together to a tester channel. The input/output circuits each are configurable via configuration circuitry to be in either a first mode or a second mode responsive to a select circuit of the configuration circuitry coupled to receive a first input for the first mode and a second input for the second mode. The select circuit is controlled responsive to a control select signal common to all or a portion of the select circuits of each of the input/output circuits.

20 Claims, 14 Drawing Sheets

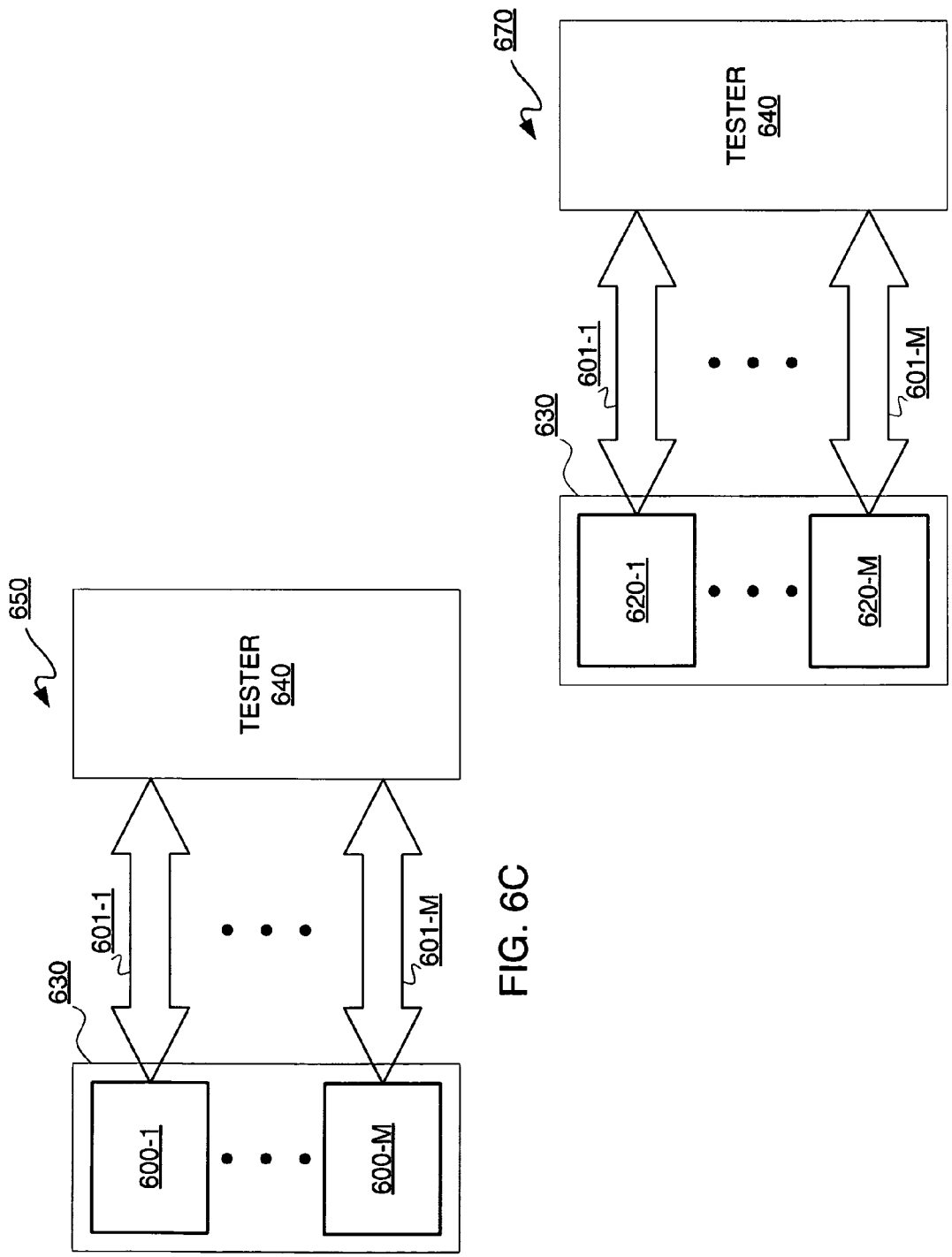

TESTING OF INPUT/OUTPUT DEVICES OF AN INTEGRATED CIRCUIT

FIELD OF THE INVENTION

One or more aspects of the invention relate generally to integrated circuits and, more particularly, to testing input/output devices of an integrated circuit.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA is the Xilinx Virtex™ FPGA available from Xilinx, Inc., 2100 Logic Drive, San Jose, Calif. 95124. Another type of PLD is the Complex Programmable Logic Device ("CPLD"). A CPLD includes two or more "junction blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

As the number of I/O resources of integrated circuits increases well in excess of the number of tester channels of testers, the limited number of tester channels for testing such I/O resources becomes problematic. Furthermore, I/O resources continue to evolve in terms of added functionality. In some instances, this added functionality is to accommodate different communication protocols. However, testing these different types of functions may involve reconfiguring test circuitry.

Accordingly, it would be desirable and useful to provide means for testing more I/O resources than there are available tester channels at one time, while being able to test multiple functions of each I/O resource without having to reconfigure a unit under test.

SUMMARY OF THE INVENTION

One or more aspects of the invention generally relate to integrated circuits and, more particularly, to testing input/output devices of an integrated circuit.

An aspect of the invention is an integrated circuit, including input/output circuits having first input/output pads. The first input/output pads are capable of being coupled together to a first tester channel. The input/output circuits each respectively include configuration circuitry coupled to at least one of the first input/output pads associated therewith. The configuration circuitry is configurable to be in either a first mode or a second mode. The configuration circuitry includes a first select circuit coupled to receive first input for the first mode and second input for the second mode. The first select circuit is configured for selecting between the first input and the second input for configuring the configuration circuitry for either the first mode or the second mode. The first select circuit of each of the input/output circuits is controlled responsive to a first control select signal.

Another aspect of the invention is a method for testing an integrated circuit. First input/output pads are coupled together, the first input/output pads being part of first input/output circuits. The first input/output pads are coupled to a first tester channel. The integrated circuit is configured for the testing. First inputs are multiplexed to configure the first input/output circuits for a test mode. The multiplexing blocks second inputs associated with a user mode of the first input/output circuits. The multiplexing is controlled responsive to a control select signal common to each of the first input/output circuits. At least one configuration of each of the first input/output circuits is checked without having to reconfigure the integrated circuit for the testing.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIGS. 6C and 6D are block diagrams depicting respective exemplary embodiments of a test system.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
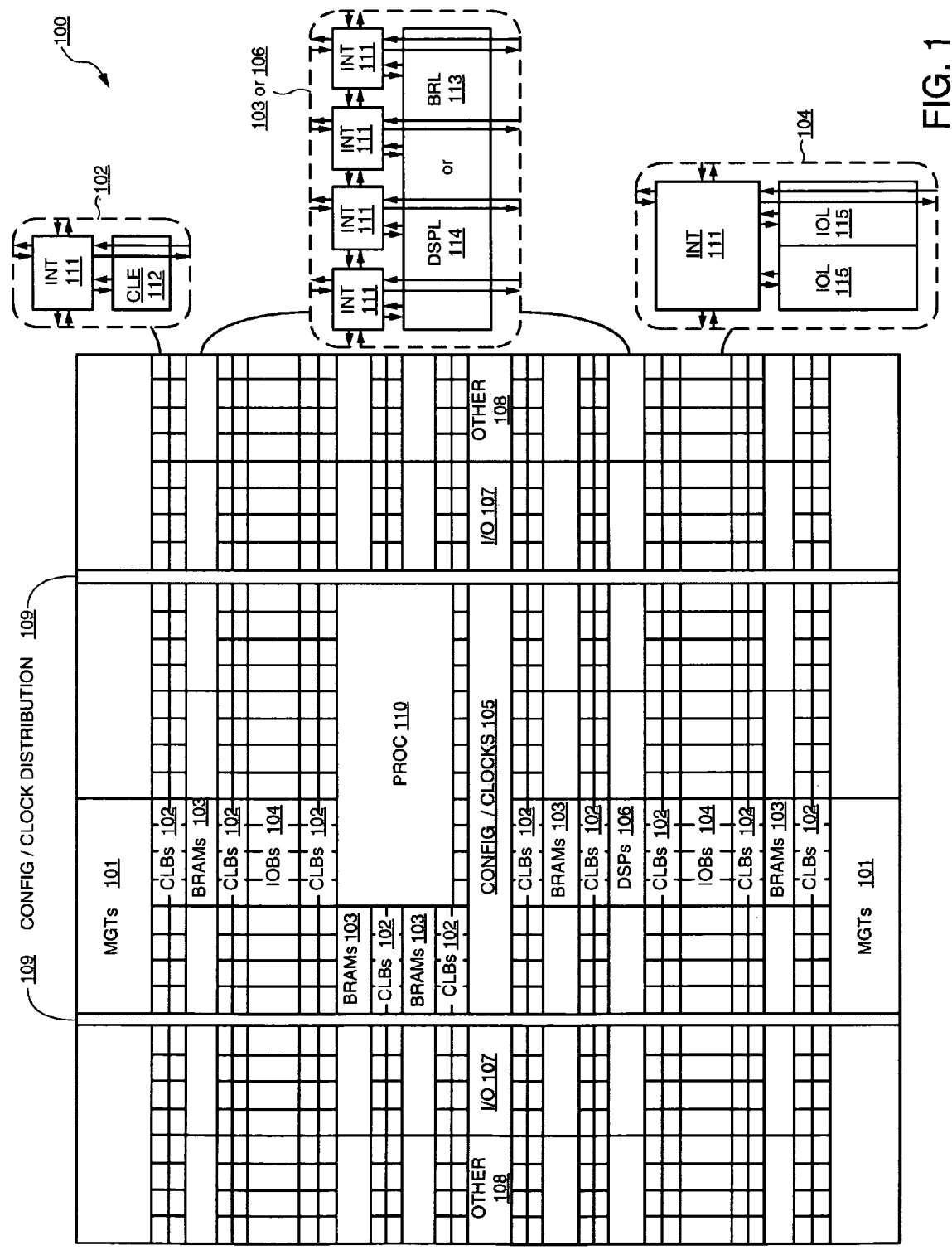
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include one or more dedicated processor blocks ("PROC") 110.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex-4™ FPGA from Xilinx of San Jose, Calif.

Figure 2:
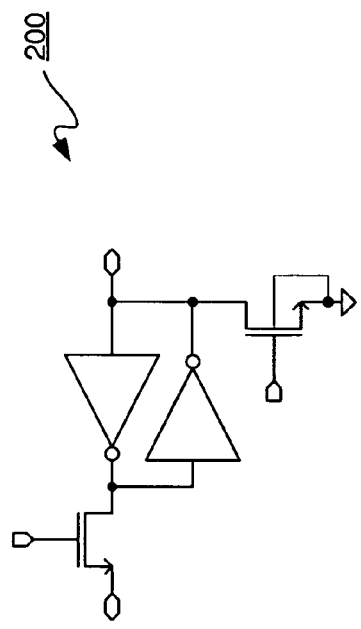
FIG. 2 is a schematic diagram depicting an exemplary embodiment of a known memory cell.

FIG. 2 is a schematic diagram depicting an exemplary embodiment of a known memory cell 200. As memory cell 200 is well known, it is not described in unnecessary detail. Furthermore, it should be appreciated that although the example of memory cell 200 is provided for purposes of clarity and not limitation, it should be appreciated that any of a variety of known storage elements, including random access memory cells, flash memory cells, anti-fuses, and fuses, among others, may be used in accordance with the following description.

Each memory cell 200 may be initialized to a known state. In a user mode, the user may program memory cell 200 to provide an output that is either a logic 0 or 1 state. In this particular example, output of memory cell 200 may be reset to a logic 0 state.

Notably, the following description will be in terms of an FPGA IOB. However, it should be appreciated that other known types of I/O resources for integrated circuits may be used in accordance with the following description.

Figure 3:
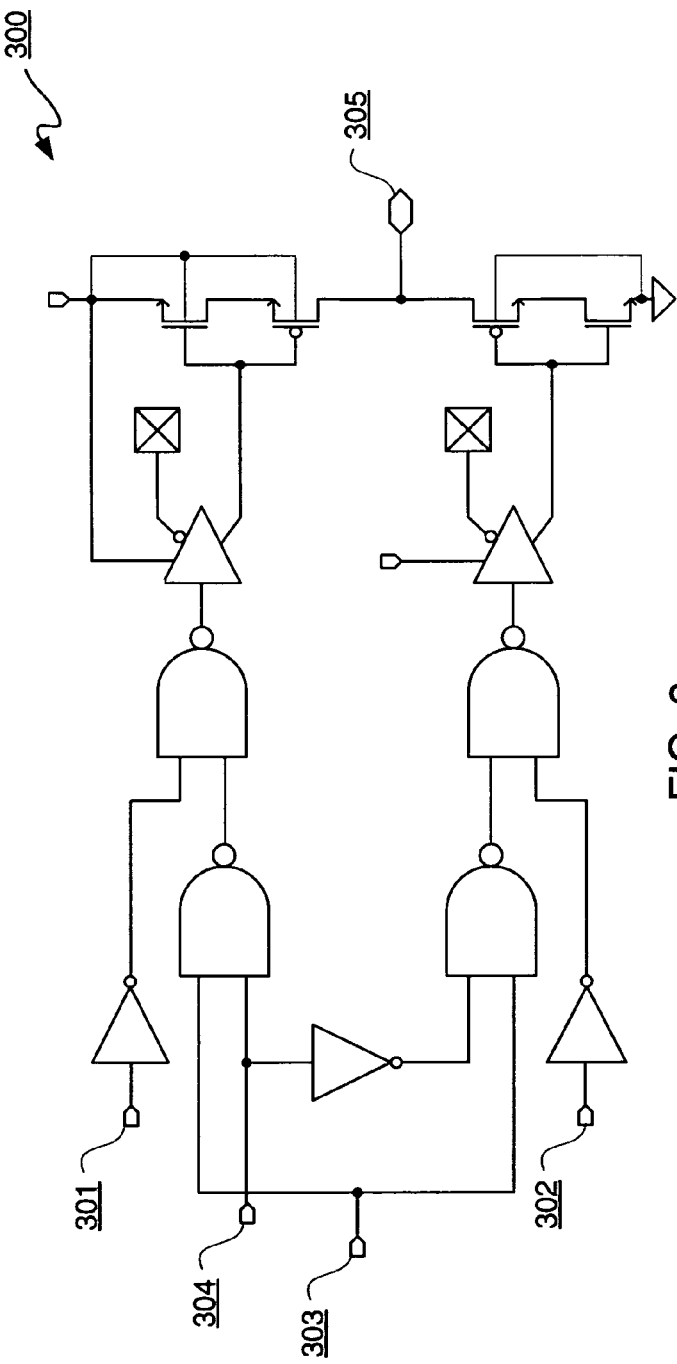
FIG. 3 is a schematic diagram depicting an exemplary embodiment of a keeper circuit.

FIG. 3 is a schematic diagram depicting an exemplary embodiment of a keeper circuit 300. As keeper circuit 300 is well known, it is not described in unnecessary detail for purposes of clarity. A pull-up signal 301 and pull-down signal 302 may be applied to keeper circuit 300. Additionally, a keeper input signal 303 may be provided to keeper circuit 300. Furthermore, a data input signal 304 may be provided to keeper circuit 300. I/O signaling 305 may be provided to, or obtained from, keeper circuit 300.

Notably, keeper circuit 300 is an example of an implementation using what is known as "weak" pull-up and pull-down voltages, namely pull-up and pull-down signals 301 and 302, respectively. Keeper circuits are generally used to assist in temporarily maintaining a data state, such as a logic 0 or logic 1, of an I/O circuit, such as an IOB.

Figure 4:
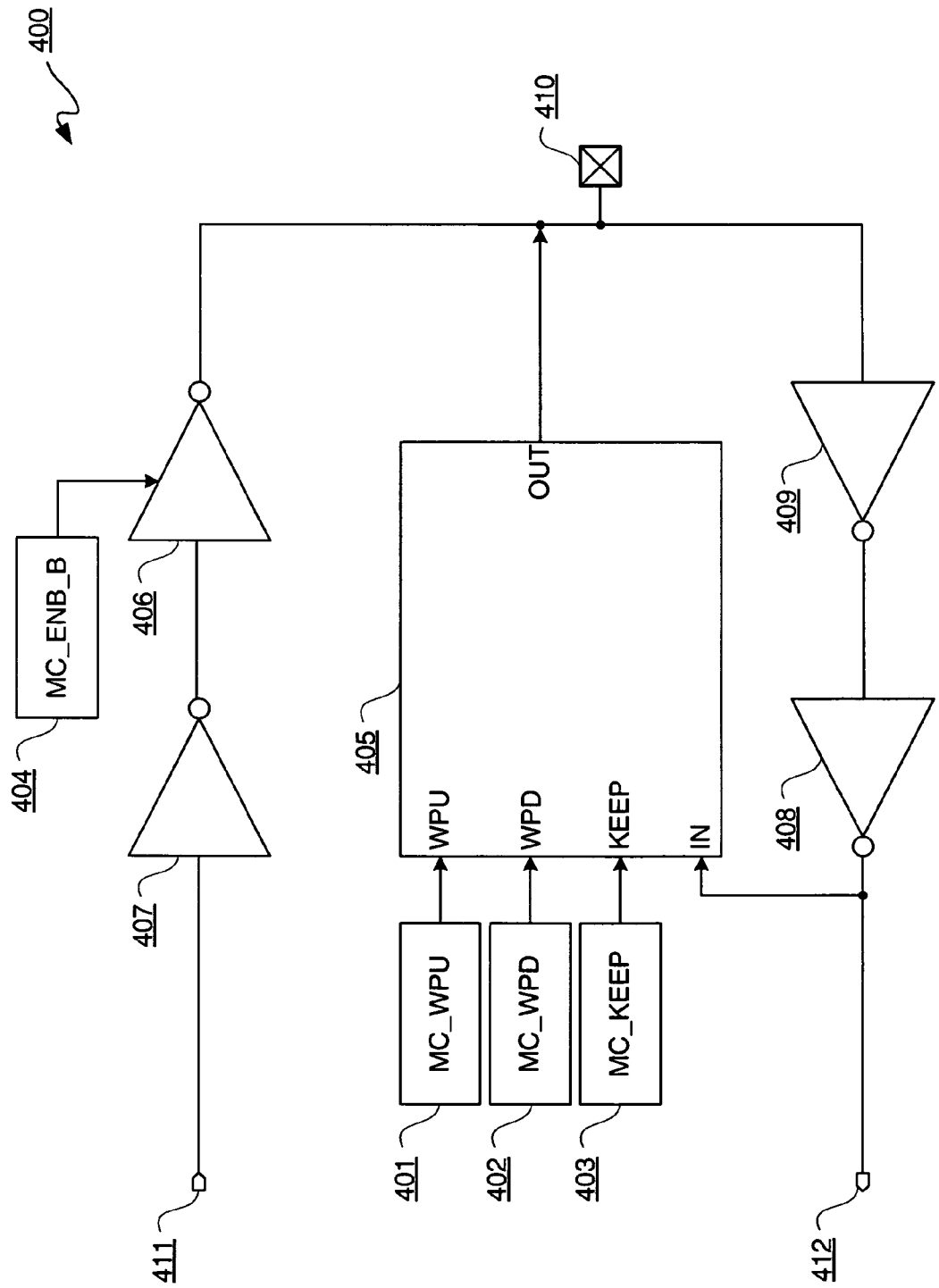
FIG. 4 is a block/schematic diagram depicting an exemplary embodiment of an input/output block ("IOB").

FIG. 4 is a block/schematic diagram depicting an exemplary embodiment of an IOB 400. IOB 400 may be an IOB of FPGA 100 of FIG. 1, such as an IOB of IOBs 104 for example. With continuing reference to FIG. 4 and renewed reference to FIG. 1, when an integrated circuit, such as FPGA 100, is powered up, each IOB 400 may be initialized to a high impedance ("HI-Z") state, sometimes referred to as "tri-state." Memory cells 401, 402, 403, and 404, for example, may be initialized to a default state, such as a logic low state. To prevent such default state from affecting operation of IOB 400 as determined by a user, a HI-Z state may be used as is known. Memory cells 401 through 404 may be formed as memory cell 200 of FIG. 2.

IOB 400 includes a keeper circuit 405, which may be keeper circuit 300 of FIG. 3. Keeper circuit 405 may be coupled to receive signals, either a logic 1 or a logic 0, from memory cells 401 through 403 in any combination thereof as may be programmed by a user. Thus, for example memory cell 401, which may be coupled to a weak pull-up input of keeper circuit 405, may provide either a logic 0 to indicate no weak pull-up is to be used or a logic 1 to indicate that a weak pull-up signal is to be used. Along those same lines, memory cell 402 may be used to provide a weak pull-down control signal to a weak pull-down input of keeper circuit 405. Lastly, memory cell 403 may be used to provide a weak keeper signal to a keeper input of keeper circuit 405.

Additionally, a user may program a memory cell 404, which is coupled to a tri-state input of output buffer 406, to place "tri-stateable" output buffer 406 in a HI-Z state. An input signal 411 may be coupled to an I/O pad 410 via a series of output buffers 407 and 406. An output signal 412 may be provided from IOB 400 by coupling I/O pad 410 to a series of input buffers 409 and 408. Additionally, output of input buffer 408 may be provided as an input to keeper circuit 405. Lastly, output of keeper circuit 405 may be provided to I/O pad 410. Again, it should be appreciated that this is an example of an IOB 400, and other known forms of I/O circuitry using keeper capabilities for maintaining data state may be used. As IOB 400 is well known, it has not been described herein in unnecessary detail.

As described in additional detail in a co-pending patent application entitled "Tester Channel Usage Reduction" by Tuyet Simmons et al., assigned application Ser. No. 11/156, 039, filed Jun. 17, 2005, multiple I/O pads, which may be I/O pads like I/O pad 410, may be tied together, namely "shorted," for coupling to a single tester channel. This effectively reduces the number of test channels used to test a part. However, to accurately test various functions of an IOB while shorting multiple I/O pads and without having to load a different configuration each time to test a single I/O resource, multiplexing may be used as described below in additional detail.

Figure 5:
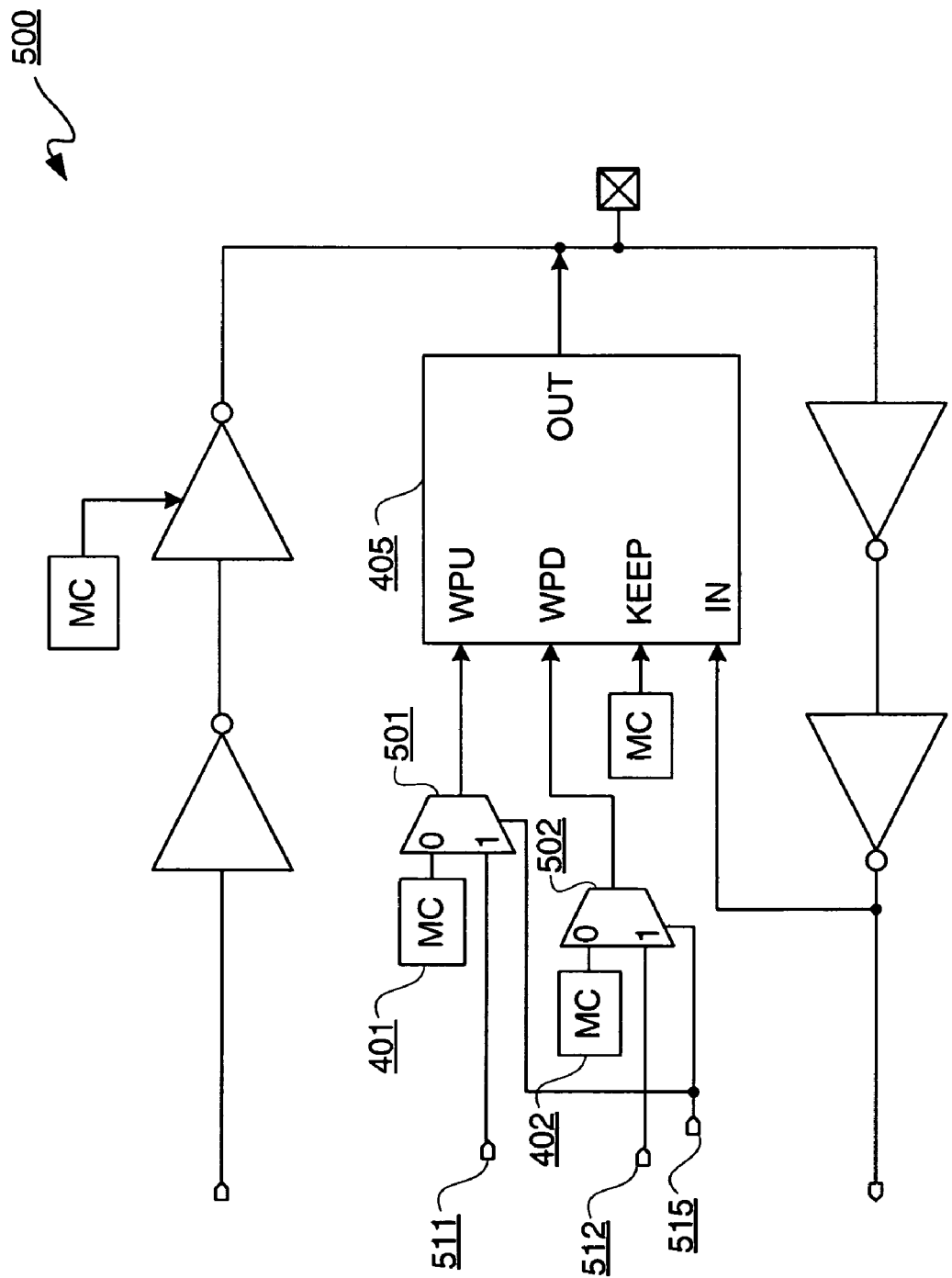
FIG. 5 is a block/schematic diagram depicting an alternative exemplary embodiment of an IOB, which may be similar to the IOB of FIG. 4, except for the addition of multiplexers.

FIG. 5 is a block/schematic diagram depicting an exemplary embodiment of an IOB 500. IOB 500 may have the same elements as IOB 400, with the addition of multiplexers 501 and 502. Accordingly, to avoid unnecessary repetition, only the differences between IOB 500 and IOB 400 are described herein.

Multiplexer 501 may be coupled between memory cell 401 and keeper circuit 405. More particularly, an output port ("output") of memory cell 401 may be coupled to an input port ("input") of multiplexer 501, and an output of multiplexer 501 may be coupled to a weak pull-up port of keeper circuit 405. Another input to multiplexer 501 may be a pull-up signal 511. Pull-up signal 511 may be passed to keeper circuit 405 via multiplexer 501 to activate a weak pull-up operation of keeper circuit 405.

Multiplexer 502 may be coupled between memory cell 402 and keeper circuit 405. More particularly, an output of memory cell 402 may be coupled to an input of multiplexer 502, and an output of multiplexer 502 may coupled to a weak pull-down port of keeper circuit 405. Another input to multiplexer 502 may be a pull-down signal 512, which may be passed to a weak pull-down port of keeper circuit 405. To select between inputs, each of multiplexers 501 and 502 may be coupled to receive a pull-up/pull-down select signal 515. Select signal 515 may be used to select which input of each of multiplexers 501 and 502 is to be provided respectively to weak pull-up and pull-down ports of keeper circuit 405.

Figure 6B:
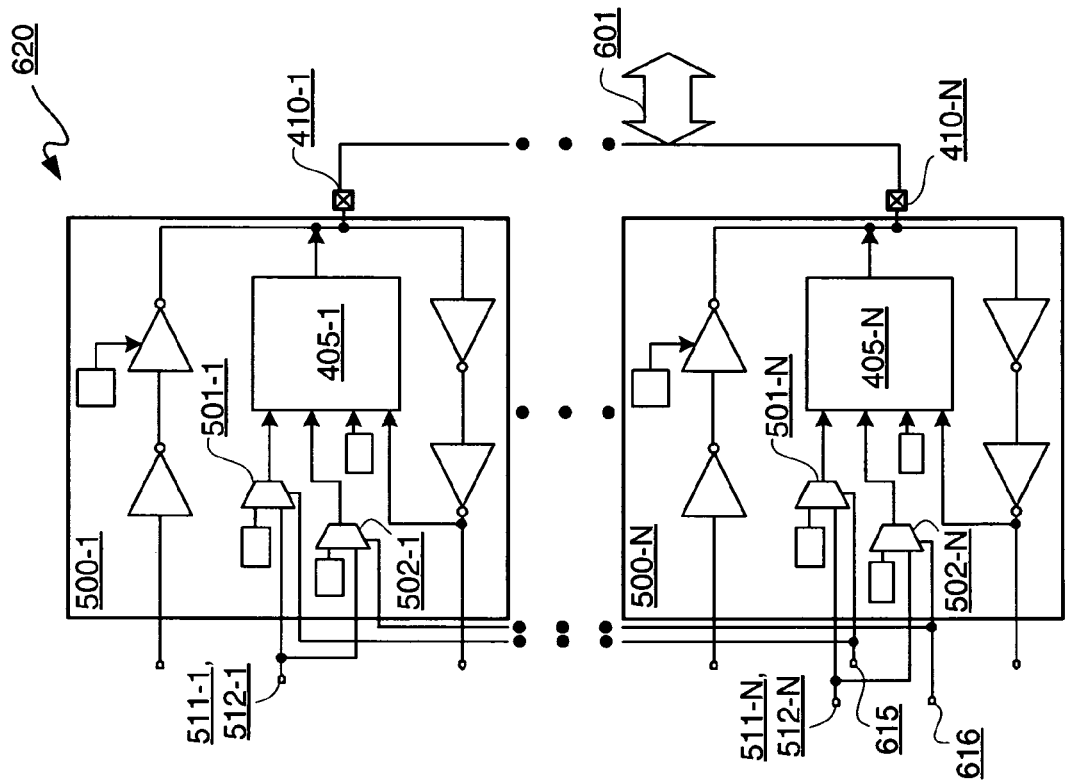
FIG. 6B is a block/schematic diagram depicting an alternative exemplary embodiment of a group of IOBs.
Figure 6A:
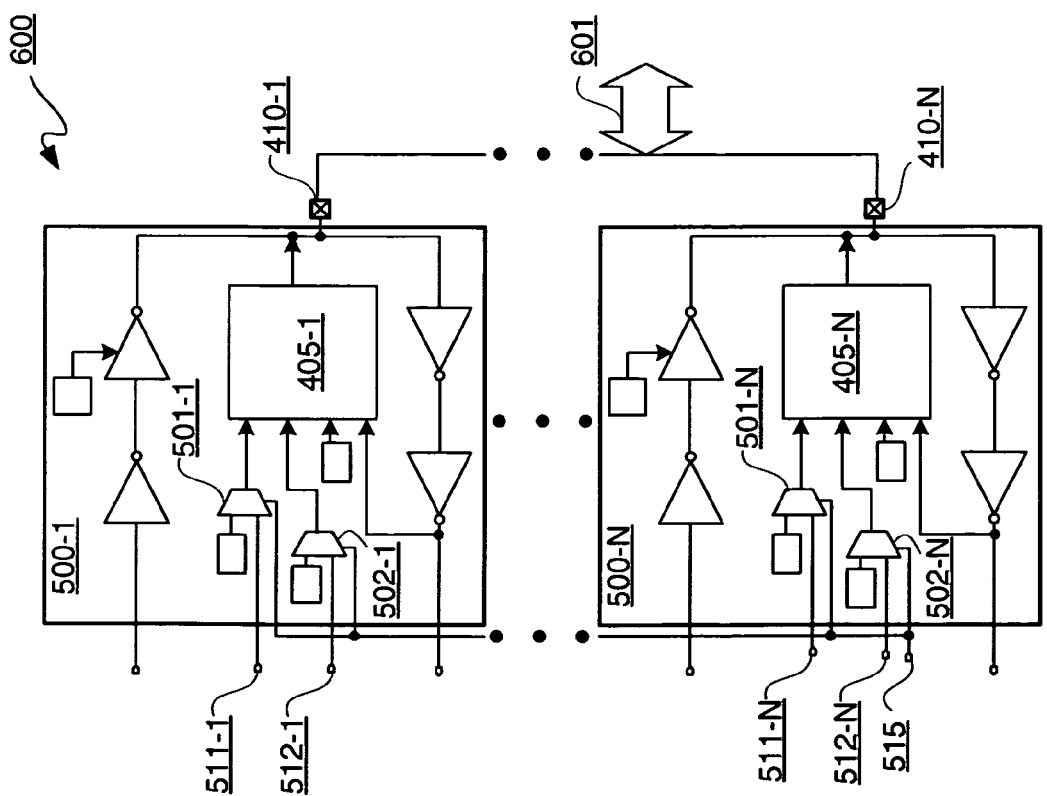
FIG. 6A is a block/schematic diagram depicting an exemplary embodiment of a group of IOBs.

FIG. 6A is a block/schematic diagram depicting an exemplary embodiment of a group 600 of IOBs 500-1 through 500-N, for N a positive integer greater than 1. For each IOB 500-1 through 500-N (collectively "IOBs 500"), there may be a respective pull-up and pull-down signal provided thereto. Thus, pull-up signals 511-1 through 511-N (collectively "pull-up signals 511") and pull-down signals 512-1 through 512-N (collectively "pull-down signals 512") are provided to respective pairs of multiplexers of IOBs 500. For example, pull-up signal 511-1 and pull-down signal 512-1 may be respectively provided to multiplexers 501-1 and 502-1 of IOB 500-1, and pull-up signal 511-N and pull-down signal 512-N may be respectively provided multiplexers 501-N and 502-N. IOBs 500 include multiplexers 501-1 through 501-N (collectively "multiplexers 501,") and multiplexers 502-1 through 502-N (collectively "multiplexers 502") for respectively receiving pull-up and pull-down signals. Notably, multiplexers 501 and 502 may all be controlled by a common select signal, namely select signal 515.

IOBs 500 may have respective I/O pads 410-1 through 410-N (collectively "I/O pads 410") which may be shorted together for coupling to a single tester channel 601. Notably, in this configuration, two sets of inputs, namely pull-up signals 511 and pull-down signals 512 may be provided to each of IOBs 500. Accordingly, the number of tester channels 601 for an integrated circuit, such as FPGA 100 of FIG. 1, may be equal to the number of groups 600 of such integrated circuit multiplied by the value of Equation 1:

$$[(2 \text{ controls\_per\_IO})*(N)]+1 \quad (1)$$

Use of separate pull-up signals 511 and pull-down signals 512 for each IOB of IOBs 500 facilitates configuring FPGA 100 in a single test configuration to test each function of all IOBs 500. Thus, testing time associated with testing such IOBs may be reduced. The time for configuring an integrated circuit for such IOB testing may be approximated by the time to load a single configuration multiplied by the number of groups 600.

As mentioned above, because two signals, namely pull-up signal 511 and pull-down signal 512, may be used for each IOB 500, and because there may be N IOBs 500 for a group 600, the number of input pins associated with providing such pull-up and pull-down signals 511 and 512 is 2N. Use of a decoder, such as a binary decoder, or other signal aggregation means as described below in additional detail with respect to FIGS. 7, 8, and 9, may be employed to reduce the number of input pins from 2N to the value of Equation 2:

$$\log_2(2N) \quad (2)$$

The number of tester channels, such as tester channels 601, for an integrated circuit such as FPGA 100 of FIG. 1, may be set equal to the number of groups 600 for such an integrated circuit times the value of Equation 3:

$$\log_2(2N)+1 \quad (3)$$

Notably, the testing time as described above apart from reconfiguration may not substantially change. However, the number of groups 600 that may be implemented may be reduced. In other words, larger groups 600 may reduce the testing time apart from a reduction in reconfiguration time. As will be described in greater detail below, in some embodiments, it may be possible to reduce the number of tester channels to a constant, in particular a constant number of tester channels that is independent of the number IOBs in each group.

FIG. 6B is a block/schematic diagram depicting an alternative exemplary embodiment of group 620 of IOBs 500-1 through 500-N. Group 620 of FIG. 6B is similar to group 600 of FIG. 6A, and thus only the differences are described to avoid repetition.

Multiplexers 501 are coupled to receive a pull-up select signal 615, and multiplexers 502 are coupled to receive a pull-down select signal 616. Thus, output of multiplexers 501 may be separately controlled from output of multiplexers 502 by select signals 615 and 616, respectively. Accordingly, as either a weak pull-up or weak pull-down signal may be applied to a keeper circuit, such as keeper circuits 405-1 through 405-N (collectively "keeper circuits 405") of each of IOBs 500 of FIGS. 6A and 6B, either a pull-up or pull-down signal may be provided to multiplexers 501 and 502 of IOBs 500. For example, a pull-up signal 511-1 may be provided as an input to both multiplexers 501-1 and 502-1 of IOB 500-1. Moreover, pull-up signal 511-N may be provided as an input to both multiplexers 501-N and 502-N of IOB 500-N. Alternatively, rather than using pull-up signals 511, such signals may be respectively replaced with pull-down signals 512. Thus, either pull-up or pull-down signals may be provided using only one input pin of each multiplexer 501 and 502 by using separate select signals for such multiplexers.

It should be appreciated that the number of tester channels 601 per integrated circuit, such as FPGA 100 of FIG. 1, may be set equal to the number of groups 620 multiplied by (N+2). Thus, with only a single configuration of FPGA 100, all the operations of all IOBs 500 of group 620 may be tested. Moreover, as each IOB of IOBs 500 of groups 620 may employ a single input pin to drive either pull-up signals 511 or pull-down signals 512, a decoder may be used, as described below in additional detail, to reduce the number of input pins from N to the value of Equation 4:

$$\log_2 N \qquad (4)$$

Even though the number of input pins may be reduced from N to the value of Equation 4 with use of a decoder, the number of tester channels 601 for an integrated circuit, such as FPGA 100 of FIG. 1, may equal the number of groups 620 multiplied by the value of Equation 5:

$$\log_2 N + 2 \qquad (5)$$

Again, the time to configure an integrated circuit, such as FPGA 100 of FIG. 1, for testing may be approximated by the time to configure a single instance of a group 620 multiplied by the number of groups 620.

FIGS. 6C and 6D are block diagrams depicting exemplary embodiments of test systems 650 and 670, respectively. In test system 650 of FIG. 6C, tester 640 is coupled to integrated circuit 630 via test channels 601-1 through 601-M, for M a positive integer greater than 1. Notably, integrated circuit 630 may be FPGA 100 of FIG. 1. For test system 650, integrated circuit 630 may include groups 600-1 through 600-M (collectively "groups 600"), where each group 600 is as described with reference to FIG. 6A. Test system 670 of FIG. 6D is similar to test system 650 of FIG. 6C, except that integrated circuit 630 may include groups 620-1 through 620-M (collectively "groups 620"), where each group 620 is as described with reference to FIG. 6B. Accordingly, as illustratively shown in FIGS. 6C and 6D respectively, test channels 601-1 through 601-M may be respectively coupled either to groups 600 or to groups 620 for testing of integrated circuit 630.

Figure 7:
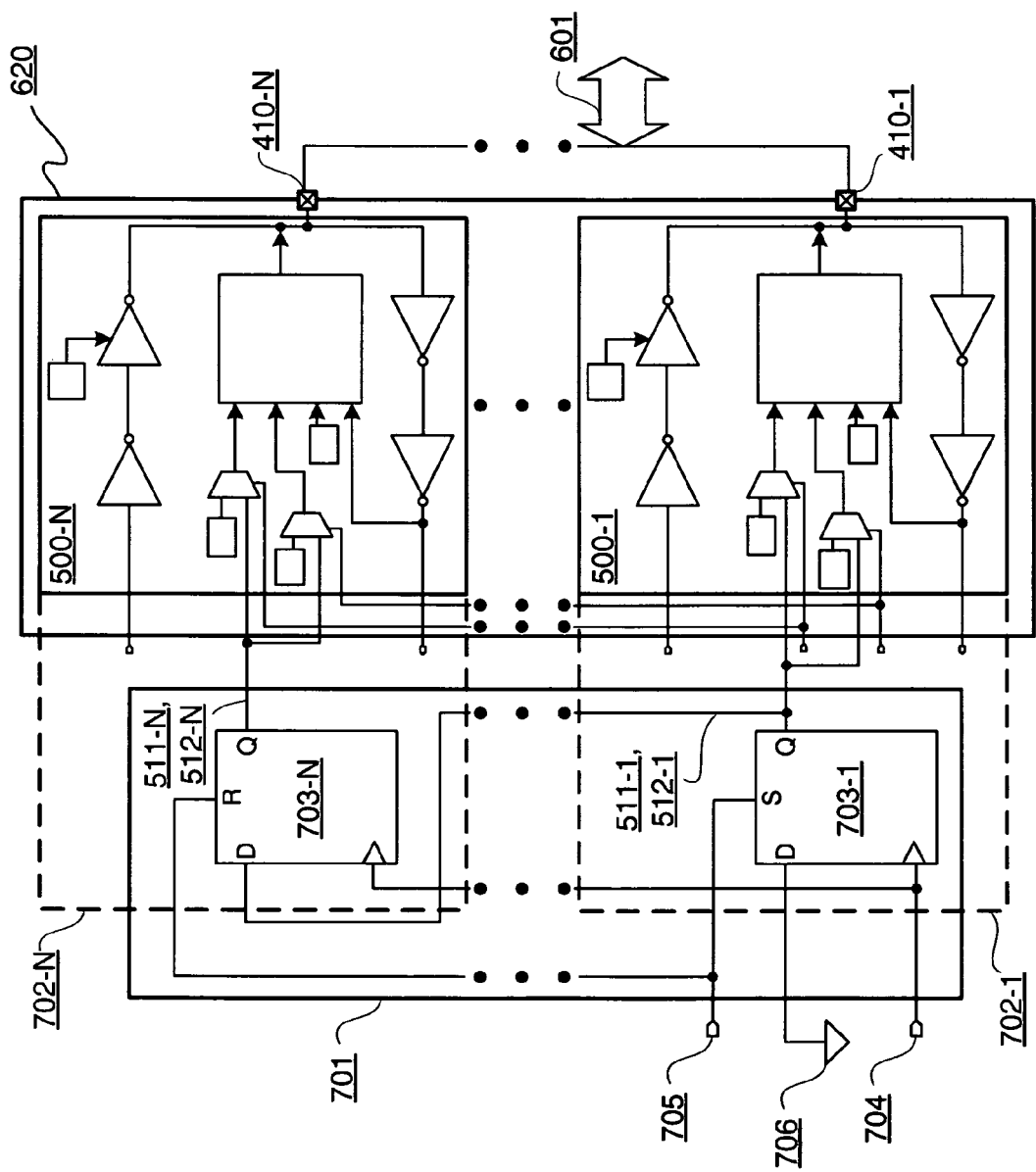
FIG. 7 is a block/schematic diagram depicting an exemplary embodiment of the group of IOBs of FIG. 6B coupled to a decoder.

FIG. 7 is a block/schematic diagram depicting an exemplary embodiment of group 620 as described with reference to FIG. 6B coupled to a decoder 701. Decoder 701 may include a register test chain ("register chain") formed of registers 703-1 through 703-N. In this example, decoder 701 is configured to test two IOB operations, namely a pull-up operation and a pull-down operation of each of IOBs 500. However, it should be appreciated that the example of FIG. 7 may be expanded to test more than the above-mentioned two operations of IOBs 500 by using more test chains for cycling through each of the operations of IOBs 500.

In this example, flip-flops 703-1 through 703-N (collectively "flip-flops 703"), which are illustratively shown as D flip-flops, are chained together to form a shift register. A same clock signal 704 may be used to clock each of flip-flops 703. Additionally, a same reset signal 705 may be used to reset each of flip-flops 703, except that flip-flop 703-1 is effectively set responsive to reset signal 705. This is because flip-flop 703-1 is the first flip-flop in the chain in this example. Again, only two operations are illustratively shown as being tested, as the data input port to flip-flop 703-1 is coupled to ground 706.

Output of flip-flops 703 are all for either pull-up or pull-down signal operation. For example, output of flip-flops 703 may either activate or deactivate a pull-up operation. Alternatively, a pull-down operation may be tested. Output of flip-flops 703, other than flip-flop 703-N, is provided to an input port of the next succeeding flip-flop 703 in the chain.

Flip-flop 703-1 is the first flip-flop in the chain of flip-flops 703. A data input to flip-flop 703-1 may be coupled to receive either a logic 0 or a logic 1, for example a logic level voltage such as ground 706 may be used to provide a logic 0 state to a data input port of flip-flop 703-1. Accordingly, for each clock cycle of clock signal 704, data input to flip-flops 703, including setting/resetting thereof, may sequentially propagate through the chain of flip-flops 703.

Again, each output of a flip-flop 703, except for the last flip-flop, namely flip-flop 703-N, is provided to the input port of the next succeeding flip-flop in the chain. For example, output of flip-flop 703-1, which may be either pull-up signal 511-1 or pull-down signal 512-1, is provided as an input to the next flip-flop, which would be the second flip-flop in the chain in this example. Thus, output of the next to last flip-flop would be provided to a data input of flip-flop 703-N. Output of each flip-flop 703-1 through 703-N may be provided as either a respective pull-up signal 511 or pull-down signal 512, such as to respective pairs of multiplexers 501 and 502.

Optionally, IOBs 500 may include flip-flops, such as flip-flops 703, which may be configured via a configuration bitstream to provide decoder 701. Thus, as illustratively shown with reference to dashed lines 702-1 through 702-N, IOBs 500 may respectively include flip-flops 703. Alternatively, flip-flops 703 may be available as part of a pool of programmable logic resources, such as programmable logic resources of FPGA 100 of FIG. 1.

In this particular example, the number of tester channels per integrated circuit is equal to the number of groups 620 multiplied by four. The number four comes from there being a tester channel for clock signal 704, a tester channel for reset signal 705, a tester channel for select signal 615 of FIG. 6B, and a tester channel for select signal 616 of FIG. 6B. Alternatively, if all I/O pads, namely I/O pads 410, were all the pads, or pins, to be shorted for testing an integrated circuit, or in other words if group 620 were the only group employed for testing such an integrated circuit, then the number of tester channels 601 may equal four. In other words, the number of tester channels 601 per integrated circuit may equal a constant number regardless of the number of I/O pads 410 per such integrated circuit. Accordingly, test configuration time may be approximated by the time it takes to configure an integrated circuit for testing with a single group, such as a single group 620 in this example.

Figure 8:
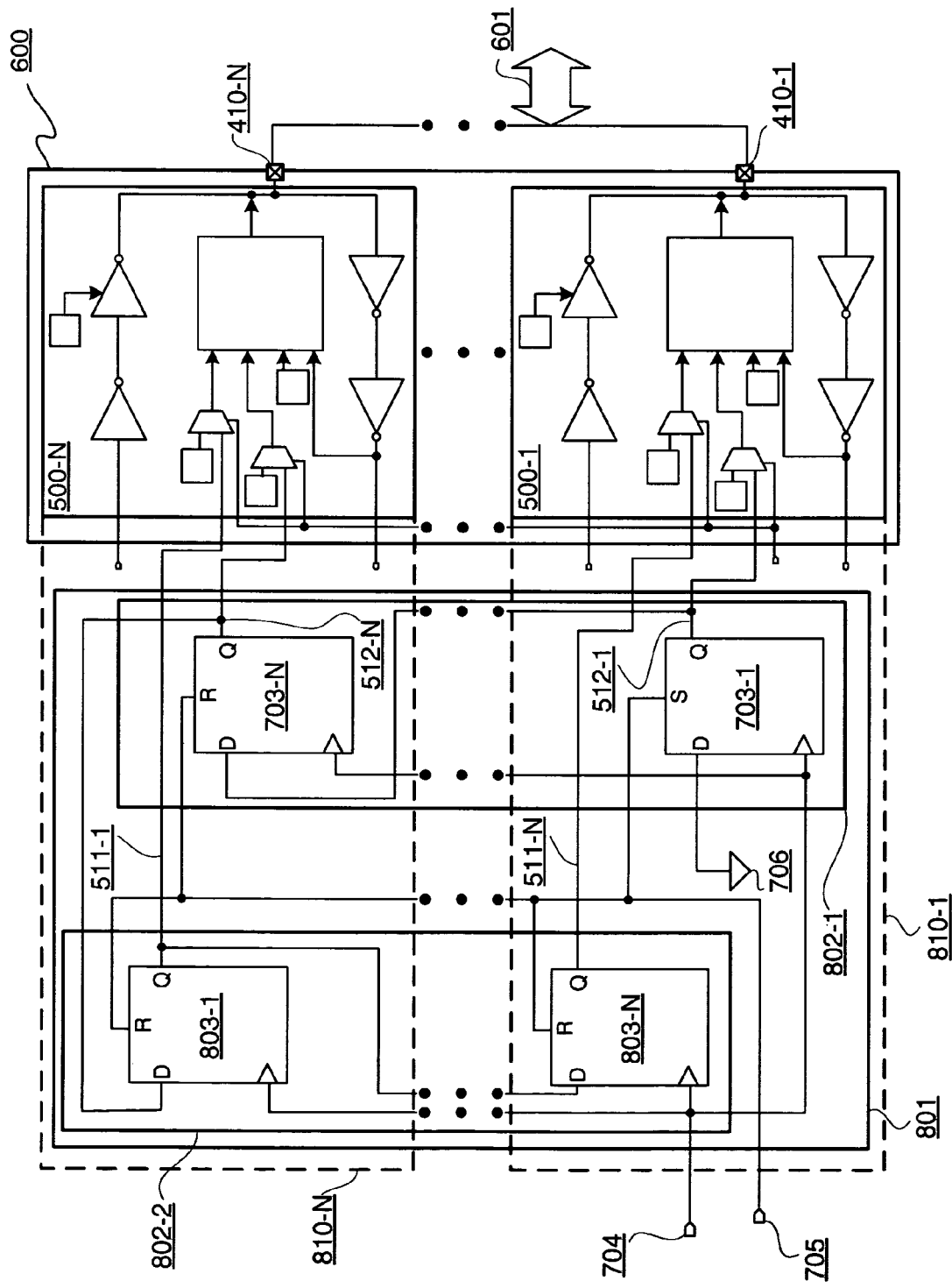
FIG. 8 is a block/schematic diagram depicting an exemplary embodiment of the group of IOBs of FIG. 6A coupled to a decoder.

FIG. 8 is a block/schematic diagram depicting an exemplary embodiment of a decoder 801 coupled to group 600 of FIG. 6A. Decoder 801 may have a test chain formed of two register chains, or chain portions, 802-1 and 802-2. Flip-flops 703 of chain 802-1 may be configured similar to a register chain of decoder 701 of FIG. 7. However, in this example, flip-flops 703 are configured to respectively output only pull-down signals 512-1 through 512-N. Additionally, the output of the last flip-flop 703-N in this chain of flip-flops 703, namely pull-down signal 512-N, is provided as a data input to flip-flop 803-1, namely the first register in register chain 802-2. Flip-flop 803-1 is part of a chain of flip-flops 803-1 through 803-N (collectively "flip-flops 803") of chain 802-2. Flip-flops 803 are respectively configured to provide pull-up signals 511-1 through 511-N for respective pull-up inputs to IOBs 500 of group 600, as previously described with reference to FIG. 6A. Notably, flip-flops 703, as well as flip-flops 803, may be clocked responsive to the same clock signal 704 and may be reset responsive to the same reset signal 705. However, as described with respect to flip-flops 703 of FIG. 7, flip-flop 703-1, which is the first flip-flop in the test chain of decoder 801, is effectively set by reset signal 705. Again, this first flip-flop, namely flip-flop 703-1, may be coupled to ground 706, for example, to provide a logic 0 to the chain.

In an exemplary implementation, some IOBs 500 may include two flip-flops per IOB. Thus, for example, flip-flops 703 and 803 may be part of IOBs 500, as generally indicated by dashed lines 810-1 through 810-N. Alternatively, flip-flops 703 or 803, including any combination thereof, may be part of programmable logic resources of an integrated circuit, such as FPGA 100 of FIG. 1, apart from programmable IOBs 500 of such integrated circuit.

In this particular example, the number of tester channels 601 per integrated circuit, such as an FPGA 100 of FIG. 1, is equal to the number of groups 600 multiplied by three. The number three comes from there being a tester channel for reset signal 705, a tester channel for select signal 515 of FIG. 6A, and a tester channel for clock signal 704.

As described above with respect to groups 620 of FIG. 7, the test configuration time may be approximated by the time it takes to configure an integrated circuit for testing with a single group multiplied by the number of groups 600. Once again, if I/O pads 410-1 through 410-N were shorted into a single test group 600, and such single test group 600 was the only group of the integrated circuit for purposes of testing, then the number of tester channels per such integrated circuit may equal three regardless of the number of I/O pads 410 per such integrated circuit. Thus, the number of tester channels needed may be independent of the number of I/O pads being tested.

Figure 9:
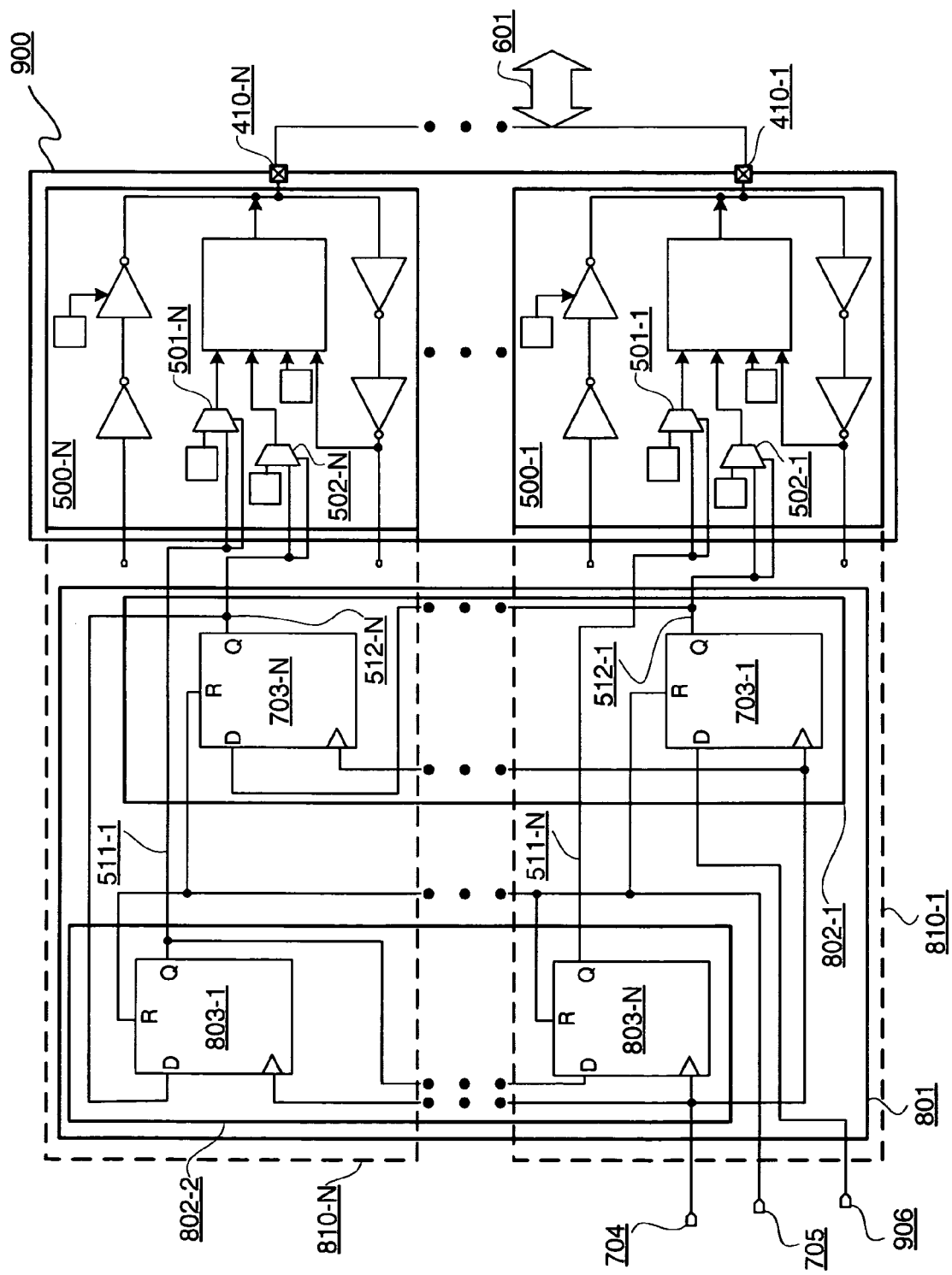
FIG. 9 is a block/schematic diagram depicting an exemplary embodiment of another test group of IOBs coupled to the decoder of FIG. 8.

FIG. 9 is a block/schematic diagram depicting an exemplary embodiment of a test group 900 coupled to decoder 801 of FIG. 8. Group 900 is similar to group 600 of FIG. 6A, with the following differences. Rather than having a single select signal 515 for controlling multiplexers 501 and 502, separate select signals are provided to each of multiplexers 501 and 502. In this particular example, the select signals are provided using respective sets of pull-up and pull-down outputs 511 and 512 obtained from decoder 801.

More particularly, pull-down signal 512-1 from flip-flop 703-1 may be provided as both a data input and a control select input to multiplexer 502-1, and this may be done through N stages to where pull-down signal 512-N from flip-flop 703-N may be provided as both a data input and a control select input to multiplexer 502-N. Moreover, pull-up signal 511-1 from flip-flop 803-1 may be provided as both a data input and a control select input to multiplexer 501-N, and through to where pull-up signal 511-N from flip-flop 803-N is provided as both a data input and a control select input to multiplexer 501-1. Notably, in this configuration, the pull-up side is sequentially opposite from the pull-down side with reference to IOBs 500.

Additionally, it should be noted that rather than coupling the data input port of flip-flop 703-1 to ground 706 as illustratively shown in FIG. 8, a data signal 906 is provided as a data input to flip-flop 703-1. Data signal 906 may be for providing a test pattern or other test data. Accordingly, reset signal 705 may be applied to flip-flops 703 and 803 to reset all such flip-flops. In this example, as in the example of FIG. 8, the number of tester channels 601 per integrated circuit is equal to the number of groups 900 multiplied by three. Furthermore, again if all the pins 410-1 through 410-N are shorted together forming a single test group 900 for testing such an integrated circuit, then the number of tester channels 601 per such integrated circuit, may be equal to three regardless of the number I/O pins 410-1 through 410-N per such integrated circuit.

Again, it should be appreciated that some IOBs may include flip-flops. Thus, IOBs 500 of group 900 of FIG. 9 may include pairs of flip-flops as previously described with reference to IOBs 500 of group 600 of FIG. 8 and as generally indicated by respective dashed lines 810-1 through 810-N.

Alternatively, for an integrated circuit with programmable logic or for that matter any integrated circuit that has extra flip-flops in the integrated circuit core that may be accessed during a test mode by users, flip-flops 703 and 803, or any portion thereof, may be obtained from such integrated circuit programmable logic or core flip-flops.

Notably, the exemplary embodiments described with reference to FIGS. 6A and 6B may be driven with a "one-hot token register chain", namely a register chain coupled to receive a single active test data state. Furthermore, the exemplary embodiments described with reference to FIGS. 7, 8, and 9 may be driven by a "one-hot token register chain." However, it should be understood that flip-flops 703 and 803 need not be dedicated flip-flops in respective IOBs 500. Rather, such flip-flops, whether in the IOBs or otherwise available as described herein, are flip-flop resources that may be shared between a user in a user mode and manufacturer in a test mode. Of course, it may be possible to provide dedicated resources, such as flip-flops as described herein for purposes of testing, however using such resources only for testing may be less efficient than having such resources available for both testing, such as by a manufacturer, and then later being available for user access in a user mode.

Register chains 802-1 and 802-2 of FIGS. 8 and 9 are merely a few examples of test chains coupled to IOBs having multiplexing capability for configuring a keeper circuit. Moreover, it should be noted that no multiplexer is illustratively shown as being coupled between a keeper memory cell 403 and keeper circuit 405 of FIG. 5. This is because keeper circuits 405 have an internal multiplexing capability for selecting either a pull-up circuit or a pull-down circuit, such as shown in the schematic diagram of FIG. 3 for example.

A keeper function of an IOB is generally associated with a single-end input or output for an I/O. However, another type of I/O circuit, known as Low-Voltage-Differential-Swing ("LVDS") may be used by combining two IOBs, as illustratively shown with reference to FIG. 10.

Figure 10:
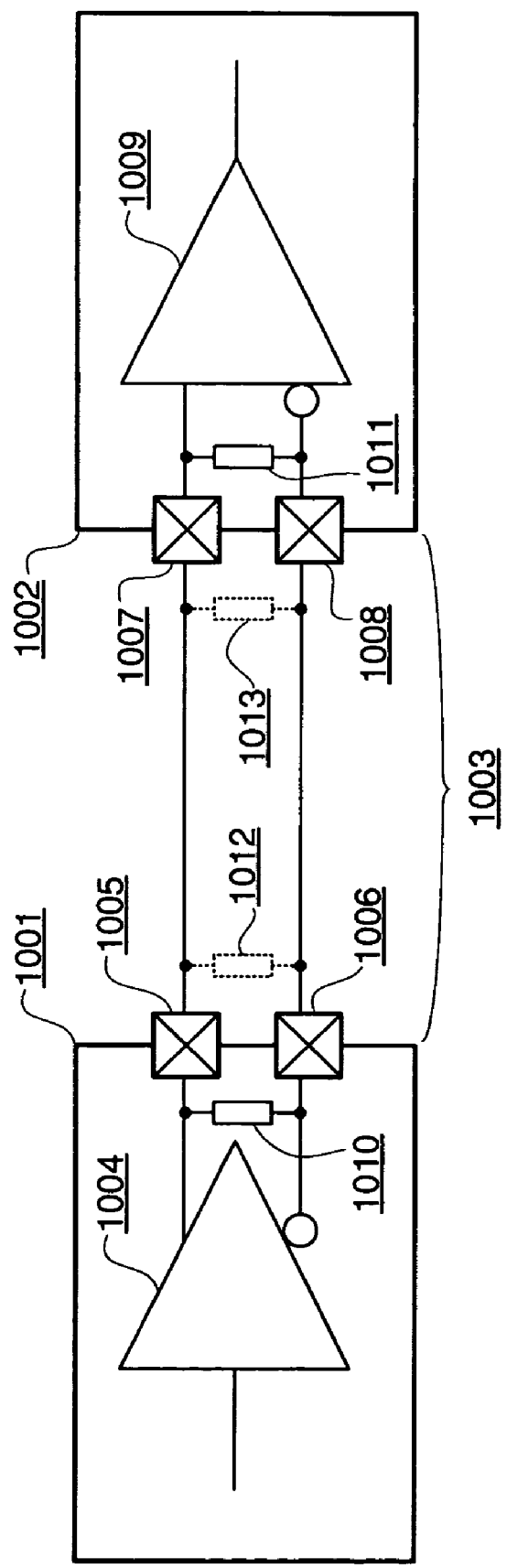
FIG. 10 is a block/schematic diagram depicting an exemplary embodiment of two integrated circuits, which may be separate integrated circuit dies or microchips, coupled to one another by a Low-Voltage-Differential-Swing ("LVDS") signaling path.

FIG. 10 is a block/schematic diagram depicting an exemplary embodiment of two integrated circuits 1001 and 1002, which may be separate integrated circuit dies or microchips, coupled to one another by an LVDS signaling path 1003. More particularly, a differential output buffer 1004 of circuit 1001 has positive side and negative side output paths respectively coupled to output pads 1005 and 1006. Pads 1005 and 1006 are respectively coupled to input pads 1007 and 1008 of circuit 1002. Notably, pads 1005 through 1008 may be I/O pads. Note that while FIG. 10 shows two integrated circuits 1001 and 1002, in some embodiments the differential buffers being tested may be located on the same die or integrated circuit. In such embodiments, board routing or an internal loopback may be used to connect the two buffers.

Pads 1007 and 1008 are respectively coupled to positive and negative input ports of differential input buffer 1009 of circuit 1002. Notably, LVDS signaling may include output and input resistors. More particularly, positive and negative output paths of circuit 1001 may be coupled to one another by a series or termination impedance ("resistor") 1010. Furthermore, input paths to input differential buffer 1009 may be coupled to one another by a resistor 1011. Optionally, as indicated by dashed boxes 1012 and 1013, alternatives to internally coupled resistors 1010 and 1011 with reference to circuits 1001 and 1002, respectively, may be externally coupled resistors. Conventionally, resistors 1010 and 1011 each have a 100 ohm resistance in accordance with a known LVDS signaling specification. However, there are various types of LVDS signaling, some of which include "LVDS", "mini-LVDS", "RSDS," and "LDT." The main difference among the various types of LVDS generally are the level of a center signal voltage, namely Vos, the delta of swing about Vos, namely Vod, and termination resistances.

Figure 11:
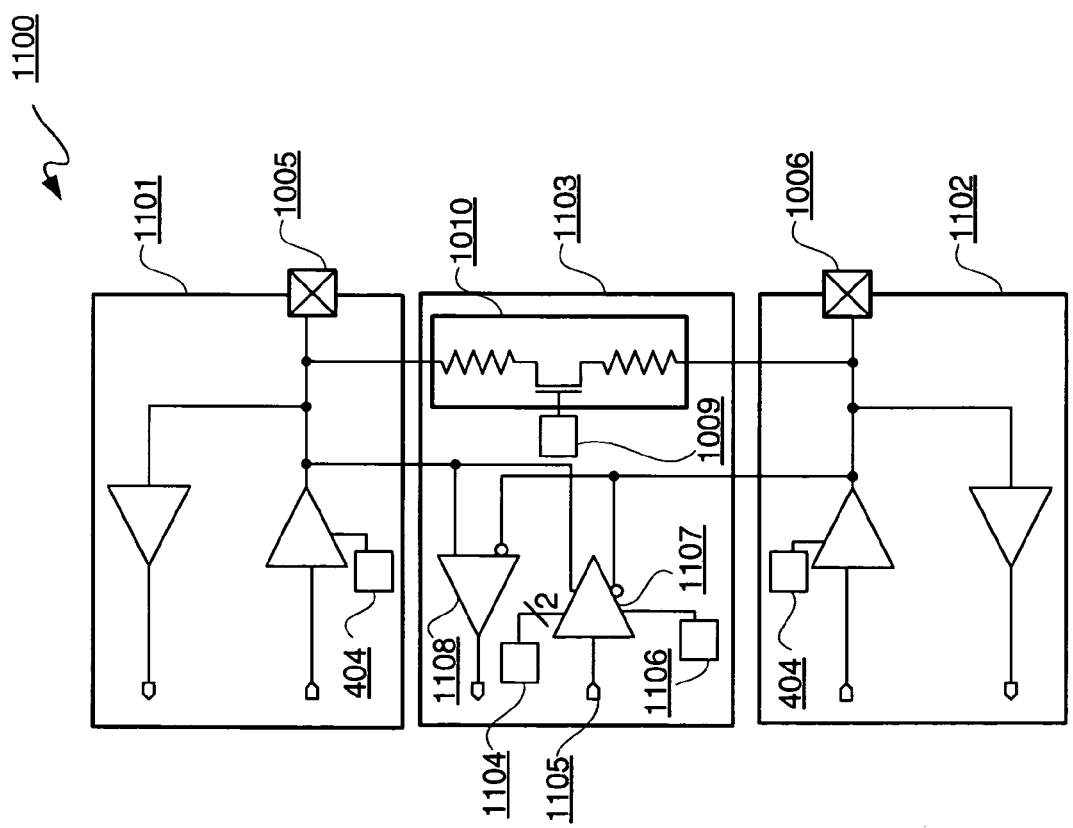
FIG. 11 is a block/schematic diagram depicting an exemplary embodiment of an LVDS IOB pair, comprising two IOBs coupled to one another by an LVDS circuit.

FIG. 11 is a block/schematic diagram depicting an exemplary embodiment of IOBs 1101 and 1102 coupled to one another by LVDS circuit 1103. In other words, circuits 1101 through 1103 generally provide an LVDS IOB pair 1100.

In this particular example, IOB 1101 is a positive side IOB and IOB 1102 is a negative side IOB. When testing LVDS, single-end output drivers respectively of IOBs 1101 and 1102 are tri-stated by programming a logic low to respective HI-Z memory cells 404 of IOBs 1101 and 1102. Two bits from memory cell 1104 of LVDS circuit 1103 may be used to decode configuration input signal 1105 to identify which type of LVDS is to be used. For purposes of clarity by way of example and not limitation, two bits may be used to identify any one of the four types LVDS specifically named above. Accordingly, fewer or more types of LVDS may be supported, and thus two or more than two bits may be used. Notably, it should be appreciated that memory cell 1104 may be capable of storing two data states, namely memory cell 1104 may be two memory cells or other storage elements as described elsewhere herein, though only one box is illustratively shown for purposes of clarity and not limitation.

Notably, if LVDS circuit 1103 is not to be used for LVDS signaling, memory cell 1106 may be used to tri-state differential output buffer 1107. However, assuming the two bits provided from memory cell 1104 to differential output buffer 1107 are for using LVDS circuit 1103 for differential signaling, negative-side and positive-side outputs may be respectively coupled from differential output buffer 1107 to IOBs 1101 and 1102. More particularly, a negative-side output of differential output buffer 1107 may be coupled to I/O pad 1006, and a positive-side output of differential output buffer 1107 may be coupled I/O pad 1005. Differential input buffer 1108 of LVDS circuit 1103 is coupled on a negative side input port to I/O pad 1006 of IOB 1102 and on a positive side input port to I/O pad 1005 of IOB 1101.

A memory cell 1109 may be used to activate or deactivate resistor 1010. In this particular example, resistor 1010 is schematically shown as two resistors coupled in series via a transistor. Thus, output of memory cell 1109 may be used to place the transistor in a substantially conductive or substantially non-conductive state.

Notably, LVDS IOB pair 1100 is merely an example of LVDS an IOB pair, and other known implementations may be used. Furthermore, as LVDS IOB pair 1100 is well known, it is not described in unnecessary detail for purposes of clarity herein.

Figure 12:
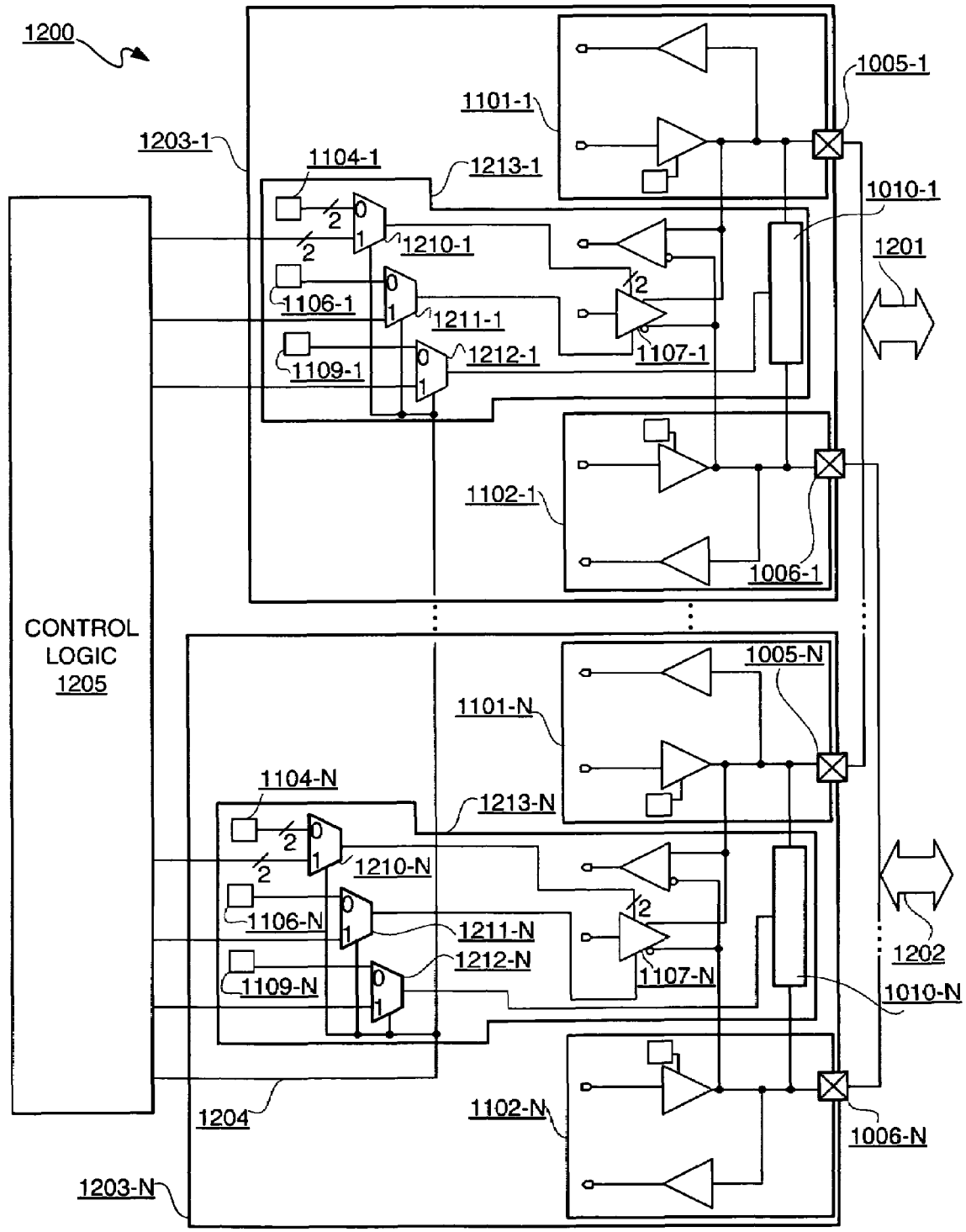
FIG. 12 is a block/schematic diagram depicting an exemplary embodiment of LVDS test circuitry.

FIG. 12 is a block/schematic diagram depicting an exemplary embodiment of LVDS test circuitry 1200. LVDS IOB pairs 1203-1 through 1203-N (collectively "IOB pairs 1203") may be coupled to control logic 1205 from LVDS test circuitry 1200. LVDS IOB pairs 1203 may be coupled to tester channels 1201 and 1202. More particularly, positive side I/O pads 1005-1 through 1005-N of IOB pairs 1203 may be coupled to tester channel 1201 and negative side I/O pads 1006-1 through 1006-N of IOB pairs 1203 may be coupled to tester channel 1202. Moreover, it should be appreciated that I/O pads 1005-1 through 1005-N are shorted to one another and I/O pads 1006-1 through 1006-N are shorted to one another.

LVDS IOB pair 1203-1 includes IOBs 1101-1 and 1102-1 as previously described with reference to FIG. 11. Furthermore, LVDS IOB pair 1203-N includes IOBs 1101-N and 1102-N, also as previously described with reference to FIG. 11. However, IOB pairs 1203-1 through 1203-N respectively include LVDS circuits 1213-1 through 1213-N (collectively "LVDS circuits 1213"), each of which is different from LVDS circuit 1103 of FIG. 11. More particularly, multiplexers 1210-1 through 1210-N (collectively "multiplexers 1210"), multiplexers 1211-1 through 1211-N (collectively "multiplexers 1211"), and multiplexers 1212-1 through 1212-N (collectively "multiplexers 1212") may be respectively part of LVDS circuits 1213-1 through 1213-N. Memory cells 1104-1 through 1104-N (collectively "memory cells 1104") may be respectively coupled to input ports of multiplexers 1210-1 through 1210-N. Thus, continuing the above example of four types of LVDS, two configuration bits may be provided to each LVDS circuit 1213 by a user when in a user mode. However, when each LVDS circuit 1213 is in a test mode, each respective multiplexer 1210 may prevent data states of each respective memory cell 1104 from passing. Thus, control logic 1205 may supply respective sets of two bits each to another input pair of each of multiplexers 1210. Outputs of multiplexers 1210-1 through 1210-N may be respectively provided as two configuration bits to control select ports of respective differential output buffers 1107-1 through 1107-N of LVDS circuits 1213.

Output of memory cells 1106-1 through 1106-N (collectively "memory cells 1106") respectively of LVDS circuits 1213 may be coupled to respective input ports of multiplexers 1211. In a user mode, output of memory cells 1106 may be provided via output of multiplexers 1211 to respective tri-state inputs of differential output buffers 1107-1 through 1107-N (collectively "differential output buffers 1107"). In a test mode, control logic 1205 may provide respective inputs to other input ports of multiplexers 1211 for output to respective tri-state ports of differential output buffers 1107.

Memory cells 1109-1 through 1109-N (collectively "memory cells 1109") are respectively coupled to multiplexers 1212 for respectively coupling their output to resistors 1010-1 through 1010-N (collectively "resistors 1010"), such as for a user mode. In a test mode, outputs of control logic 1205 may be respectively provided to other inputs of multiplexers 1212 for respective output to resistors 1010.

It should be appreciated that control logic 1205 may be used to provide a select signal 1204 for selecting between a user mode and a test mode. Accordingly, select signal 1204 may be provided to each of multiplexers 1210, 1211, and 1212. Notably, in this exemplary embodiment, multiplexers 1210, 1211, and 1212 may be formed using dedicated, as opposed to programmable, logic resources for forming part of LVDS circuits 1213. However, control logic 1205 may be formed of dedicated or programmable logic, or a combination thereof.

Thus, for example, in a test mode, LVDS test circuitry 1200 may be configured such that all LVDS functions or operations, including functions associated with different LVDS types, resistor types, or LVDS tri-state conditions, or any combination thereof, may be controlled by control logic 1205. Control logic 1205 may include a test chain, such as a chain of registers, as described below in additional detail. Thus, all tests may be done using a single configuration load to test each IOB pair of IOB pairs 1203, such as for cycling through testing one or more than one I/O circuit at a time. Furthermore, I/O circuit testing may be done using fewer tester channels. In this particular example, an example implementation of which is described in additional detail with reference to FIG. 13A, the number of tester channels, such as tester channels 1201 and 1202, per integrated circuit, such as FPGA 100 of FIG. 1, is equal to 9. The number 9 comes from there being one tester channel for each select signal input, each data signal input, each clock signal input, and each reset signal input, and one tester channel for each grouping of positive-side IOB I/O pads shorted to one another and each grouping of negative-side IOB I/O pads shorted to one another. Again, the testing time may involve merely a single configuration of the integrated circuit, as opposed to multiple reconfigurations, for purposes of testing. Accordingly, a configuration/reconfiguration portion of testing time may be substantially reduced.

Figure 13A:
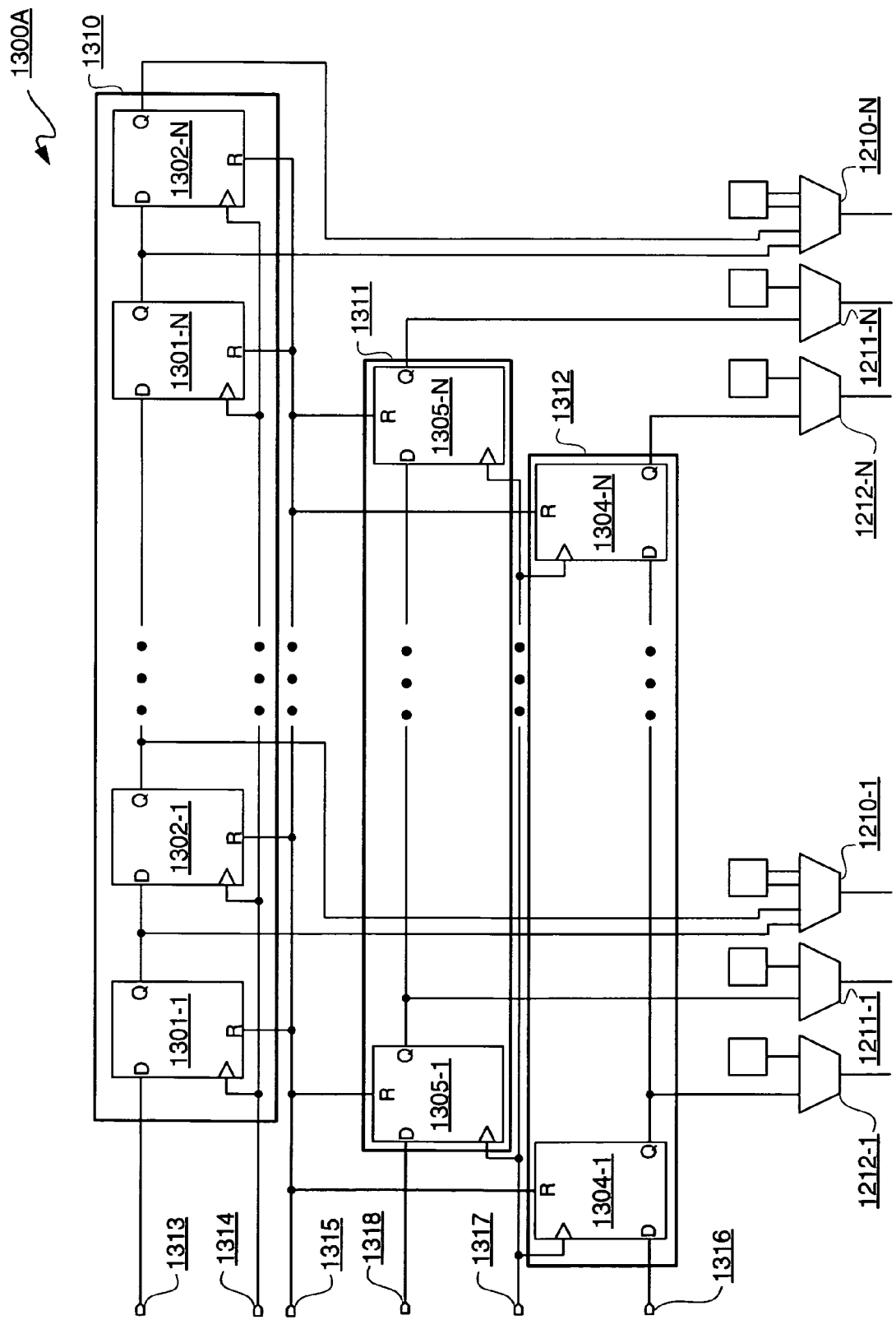
FIG. 13A is a schematic diagram depicting an exemplary embodiment of register chains which may be implemented as part of control logic of the LVDS test circuitry of FIG. 12.

FIG. 13A is a schematic diagram depicting an exemplary embodiment of register chains 1300A. Register chains 1300A may be implemented as part of control logic 1205 of FIG. 12.

Register chains 1300A includes register chain 1310, register chain 1311, and register chain 1312. Register chain 1310 includes registers 1301-1 through 1301-N (collectively "registers 1301") and registers 1302-1 through 1302-N (collectively "registers 1302"). Register chain 1311 includes registers 1305-1 through 1305-N (collectively "registers 1305"), and register chain 1312 includes 1304-1 through 1304-N (collectively "registers 1304"). Notably, registers are again illustratively shown as implemented using D-type flip-flops; however, other types of sequentially activated circuits may be used.

Registers 1301, 1302, 1304, and 1305 are reset responsive to reset signal 1315. Registers 1301 and 1302 are clocked responsive to clock signal 1314, and registers 1304 and 1305 are clocked responsive to clock signal 1317. Data input 1313, which may be for a test pattern, may be provided to a data input port of register 1301-1, and output of register 1301-1 may be provided to a data input port of register 1302-1 and as an input to multiplexer 1210-1 of LVDS circuit 1203-1 of FIG. 12, namely a bit of a two bit configuration input to be provided to differential output buffer 1107-1 of FIG. 12 as previously described. Output of register of 1302-1 is provided to a data input port of a next register of registers 1301 in register chain 1310 as well as to an input port of multiplexer 1210-1, namely the other bit of the two bit configuration input previously described with reference to FIG. 12. Accordingly, register chain 1310 progresses to registers 1301-N and 1302-N. Output of register 1301-N is provided to a data input port of multiplexer 1210-N and to a data input port of register 1302-N, and output of register 1302-N is provided to another data input port of multiplexer 1210-N; in other words, the two bit configuration input is provided from registers 1301-N and 1302-N, respectively, to multiplexer 1210-N as previously described with reference to FIG. 12.

As noted above, registers 1304 and 1305 may be clocked responsive to clock signal 1317. Registers 1304 and 1305 are separate chains, and thus data input 1316, which may be for a test pattern, which may be the same or different from data input 1313, may be provided to a data input port of register 1304-1, and data input 1318, which may be for a test pattern, which may the same or different from either or both of data inputs 1313 and 1316, may be provided to a data input port of register 1305-1. Output of registers 1304-1 and 1305-1 may be respectively provided to input ports of multiplexers 1212-1 and 1211-1, as previously described with reference to FIG. 12. Additionally, outputs of registers 1304-1 and 1305-1 may be respectively provided to the next registers in their respective chains. The last registers in register chains 1312 and 1311, namely registers 1304-N and 1305-N respectively, may be coupled to provide their outputs to input ports of multiplexers 1212-N and 1211-N.

Accordingly, it should be appreciated that in a test mode, memory cells 1104, 1106, and 1109 may be bypassed using multiplexed output from register chains 1300A. In a test mode, an integrated circuit, such as FPGA 100 of FIG. 1, may be configured such that each of the operations of LVDS circuits 1213 of FIG. 12, such as different types of LVDS, different types of series resistance, or different types of LVDS tri-stating, or any combination thereof, are controlled by control logic 1205 of FIG. 12. Control logic 1205 of FIG. 12 may include a register chain, such as register chains 1300A, to provide test signaling. Thus, all tests may be done using a single test configuration of the integrated circuit. In this particular configuration, the number of tester channels, such as channels 1201 and 1202 of FIG. 12, per integrated circuit such as FPGA 100 of FIG. 1, is equal to 9, namely one tester channel for negative side grouped I/O pads 1006-1 through 1006-N, one tester channel for positive side grouped I/O pads 1005-1 through 1005-N, and one tester channel for each of signals 1204 and 1313 through 1318. Again, configuration testing time may be reduced owing to only having to configure the integrated circuit once.

When the integrated circuit is placed back into a user mode, if registers 1301, 1302, 1304, and 1305 are from a pool of programmable logic resources, such registers may be returned to such pool for use by a user application. In such a user mode, select signal 1204 of FIG. 12 may be coupled to a memory cell, fuse, anti-fuse, or other programmable element to cause outputs of memory cells 1104, 1106, and 1109, as programmed by a user, to be passed by multiplexers 1210, 1211, and 1212, respectively.

Figure 13B:
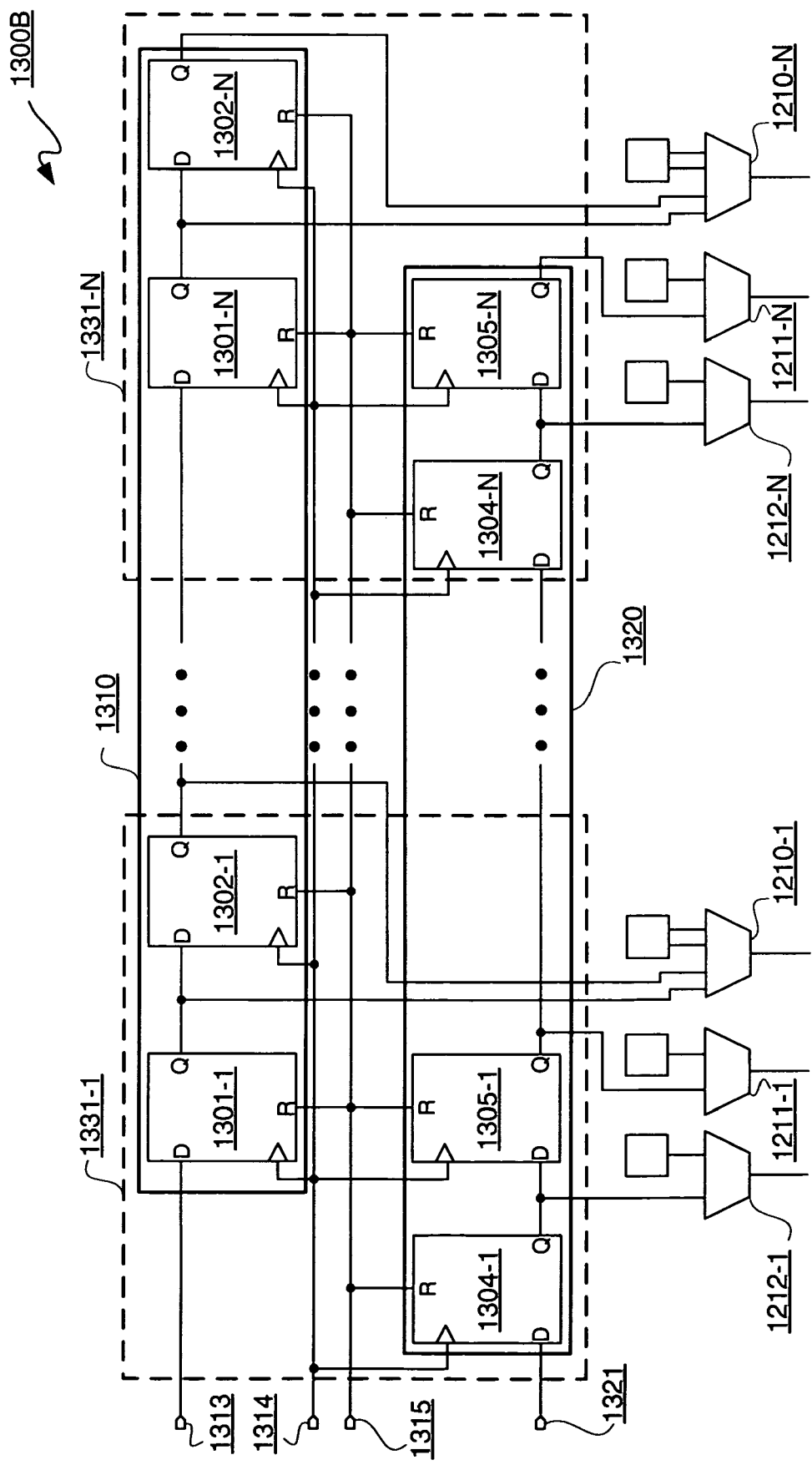
FIG. 13B is schematic diagram depicting an exemplary alternative embodiment of register chains which may be implemented as part of control logic of the LVDS test circuitry of FIG. 12.

FIG. 13B is schematic diagram depicting an exemplary alternative embodiment of register chains 1300B. Register chains 1300B include register chain 1310 and register chain 1320. As register chain 1310 was previously described, such description is not repeated.

With reference to register chain 1320, registers 1304 and 1305 are clocked responsive to clock signal 1314 as are registers 1301 and 1302 of register chain 1310. By cascading registers for tri-stating differential output buffers 1107 and resistors 1010 of FIG. 12, register chains 1310 and 1320 may be equal or at least approximately equal in length such that they may be a clocked by a same clock signal 1314. By having the same clock signal 1314 for both register chains 1310 and 1320, a same source for such clock signal 1314 may be used. For example, if such source is provided off-chip, such as via a tester, then only one tester channel may be used to provide such clock signal 1314, as compared with having to provide two tester channels for providing two separate clock signals, such as in the exemplary embodiment of FIG. 13A.

Input data 1321, which may be for a test pattern, may be provided to a data input port of register 1304-1. Output of register 1304-1 may be provided as an input to multiplexer 1212-1 and to a data input port of register 1305-1. Output of register 1305-1 may be provided to an input of multiplexer 1211-1 and to a next register of registers 1304. At the end of register chain 1320, data may be provided to a data input port of register 1304-N, and the output of register 1304-N may be provided to an input of multiplexer 1212-N as well as to a data input port of register 1305-N. Output of register 1305-N may be provided to an input of multiplexer 1211-N.

The number of tester channels, such as tester channels 1201 and 1202 of FIG. 12, for an integrated circuit, such as FPGA 100 of FIG. 1, for this example may equal 7. The number 7 comes from one tester channel for negative side grouped I/O pads 1006-1 through 1006-N, one tester channel for positive side grouped I/O pads 1005-1 through 1005-N, and one tester channel for each of signals 1204, 1313 through 1315, and 1321. Again, such integrated circuit may be configured in a single configuration instance, and thus configuration test time may be reduced.

As illustratively shown in FIGS. 13A and 13B, registers 1301, 1302, 1304 and 1305 may be part of programmable logic resources external to LVDS circuits 1213 of FIG. 12, namely part of control logic 1205. Alternatively, it should be appreciated that LVDS I/O pairs 1203 may include four flip-flops each. Accordingly, LVDS I/O pairs 1203 may include sets of four registers each of registers 1331-1 through 1331-N. Thus, for example, registers 1301-1, 1302-1, 1304-1, and 1305-1 may be part of LVDS I/O pair 1203-1, and more particularly may be part of LVDS circuit 1213-1. Moreover, for example, registers 1301-N, 1302-N, 1304-N, and 1305-N may be part of LVDS I/O pair 1203-N, and more particularly part of LVDS circuit 1213-N.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. An integrated circuit, comprising:
   input/output circuits of an integrated circuit die associated with the integrated circuit, the input/output circuits having first input/output pads;
   the first input/output pads of the integrated circuit die being directly connected to one another, wherein the first input/output pads in combination are a first node for coupling to a first tester channel;
   the input/output circuits each respectively including:
      configuration circuitry coupled to one or more of the first input/output pads associated therewith;
      the configuration circuitry configurable to be in either a first mode or a second mode;
      the configuration circuitry including a first select circuit coupled to receive a first input for the first mode and a second input for the second mode; and
      the first select circuit configured for selecting between the first input and the second input for configuring the configuration circuitry for either the first mode or the second mode, the first select circuit of each of the input/output circuits controlled responsive to a first control select signal.

2. The integrated circuit according to claim 1, wherein:
   the input/output circuits have second input/output pads;
   the second input/output pads of the integrated circuit die being directly connected to one another, wherein the second input/output pads in combination are a second node for coupling to a second tester channel; and
   the configuration circuitry of an input/output circuit of the input/output circuits being coupled between an associated first pad of the first input/output pads and an associated second pad of the second input/output pads.

3. The integrated circuit according to claim 2, wherein the input/output circuit includes a pair of input/output blocks for one or more of one type of Low-Voltage Differential Signaling.

4. The integrated circuit according to claim 2, wherein:
   the configuration circuitry includes a differential output buffer;
   the differential output buffer has a configuration port and a tri-state port;
   the configuration port is coupled to receive output from the first select circuit; and
   the tri-state port is coupled to receive output from a second select circuit of the configuration circuitry.

5. The integrated circuit according to claim 4, wherein:
   the configuration circuitry includes a first storage device for providing the first input to the first select circuit and a second storage device for providing a third input to the second select circuit;
   the first select circuit is associated with a first register device for receiving the second input; and
   the second select circuit is associated with a second register device for receiving a fourth input by the second select circuit.

6. The integrated circuit according to claim 5, wherein:
   the configuration circuitry includes a series impedance circuit coupled between the first pad and the second pad;
   the series impedance circuit coupled to receive output from a third select circuit of the configuration circuitry;
   the configuration circuitry includes a third storage device for providing a fifth input to the third select circuit; and
   the third select circuit is associated with a third register device for receiving a sixth input by the third select circuit.

7. The integrated circuit according to claim 6, wherein the first register device, the second register device, and the third register device are part of three separate register chains.

8. The integrated circuit according to claim 6, wherein the first register device is part of a first register chain; and wherein the second register device and the third register device are part of a second register chain.

9. The integrated circuit according to claim 8, wherein the first register device includes a plurality of flip-flops; and wherein the first register chain and the second register chain are clocked responsive to a same clock signal.

10. The integrated circuit according to claim 6, wherein the first register device, the second register device, and third register device are obtained from programmable logic resources.

11. The integrated circuit according to claim 10, wherein:
    the programmable logic resources are part of the input/output circuits;

the first mode is a user mode with which the first input, the third input, and the fifth input are associated; and the second mode is a test mode with which the second input, the fourth input, and the sixth input are associated.

12. The integrated circuit according to claim 1, wherein the configuration circuitry includes a keeper circuit;

the keeper circuit having a first port and a second port;

the first port coupled to receive output from the first select circuit; and the second port coupled to receive output from a second select circuit of the configuration circuitry.

13. The integrated circuit according to claim 12, wherein the configuration circuitry includes a first storage device for providing the first input to the first select circuit and a second storage device for providing a third input to the second select circuit; and wherein the second select circuit is coupled to receive a fourth input.

14. The integrated circuit according to claim 13, wherein the first select circuit and the second select circuit of each of the input/output circuits are controlled responsive to the first control select signal.

15. The integrated circuit according to claim 13, wherein the second select circuit of each of the input/output circuits is controlled by a second control select signal; and wherein the second input and the fourth input are a same input signal.

16. The integrated circuit according to claim 13, wherein the input/output circuits are coupled to a register chain for receiving the second input by the first select circuit and the fourth input by the second select circuit.

17. The integrated circuit according to claim 16, wherein the second input provided to the first select circuit is further used as the first control select signal; and wherein the fourth input provided to the second select circuit is further used as a second control select signal, the second select circuit of each of the input/output circuits being controlled responsive to the second control select signal.

18. A method for testing an integrated circuit, comprising:

directly connecting first input/output pads of an integrated circuit die associated with the integrated circuit together to provide a first node, the first input/output pads respectively being part of first input/output circuits;

coupling the first node associated with the first input/output pads to a first tester channel;

configuring the integrated circuit for the testing, the configuring including:

multiplexing first inputs to configure the first input/output circuits for a test mode;

the multiplexing blocking second inputs associated with a user mode of the first input/output circuits;

the multiplexing being controlled responsive to a control select signal common to each of the first input/output circuits; and checking one or more configuration of each of the first input/output circuits without having to reconfigure the integrated circuit for the testing.

19. The method for testing according to claim 18, further comprising:

directly connecting second input/output pads of the integrated circuit die together to provide a second node, the second input/output pads respectively being part of second input/output circuits;

coupling the second node associated with the second input/output pads to a second tester channel;

wherein the configuring includes:

the multiplexing of the first inputs to configure the second input/output circuits for the test mode and for blocking of the second inputs associated with the user mode of the second input/output circuits;

the multiplexing being controlled responsive to the control select signal common to each of the second input/output circuits; and checking the configuration of each of the second input/output circuits without having to reconfigure the integrated circuit for the testing.

20. The method according to claim 19, wherein the configuring includes programming programmable logic of the integrated circuit.

* * * * *